(12) United States Patent
Yun et al.

(10) Patent No.: US 12,105,132 B2
(45) Date of Patent: Oct. 1, 2024

(54) ELECTRIC FIELD MEASURING APPARATUS AND METHOD OF MEASURING ELECTRIC FIELD USING THE SAME

(71) Applicant: Samsung Electronics Co., Ltd., Suwon-si (KR)

(72) Inventors: Jinyeong Yun, Yongin-si (KR); Meehyun Lim, Seoul (KR); Sungjin Kim, Suwon-si (KR); Masahiko Yamabe, Hwaseong-si (KR); Sungyeol Kim, Yongin-si (KR); Sungyong Lim, Seoul (KR); Sunghwi Cho, Gwangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 17/975,202

(22) Filed: Oct. 27, 2022

(65) Prior Publication Data
US 2023/0194591 A1 Jun. 22, 2023

(30) Foreign Application Priority Data
Dec. 21, 2021 (KR) .......................... 10-2021-0184295

(51) Int. Cl.
*G01R 29/12* (2006.01)
*H01L 21/66* (2006.01)
(Continued)

(52) U.S. Cl.
CPC .......... *G01R 29/12* (2013.01); *H01L 21/6833* (2013.01); *H01L 21/68742* (2013.01); *H01L 22/12* (2013.01)

(58) Field of Classification Search
CPC ................ G01R 29/12; H01L 21/6833; H01L 21/68742; H01L 22/12
See application file for complete search history.

(56) References Cited

U.S. PATENT DOCUMENTS 5,128,950 A * 7/1992 Tsuchiya ............. H01S 5/06835
372/30
6,353,210 B1 * 3/2002 Norrbakhsh ............ C30B 31/18
219/390

(Continued)

FOREIGN PATENT DOCUMENTS

JP 2020051871 A 4/2020
KR 100819078 B1 4/2008
(Continued)

OTHER PUBLICATIONS https://youtu.be/6GfaKGXuh9E (Sep. 1, 2018).

*Primary Examiner* — Scott Bauer
(74) *Attorney, Agent, or Firm* — Muir Patent Law, PLLC

(57) ABSTRACT

An electric field measuring apparatus includes an electrostatic chuck with a through hole and holding a wafer, a lift pin picking up the wafer, a driver vertically moving the lift pin along the through hole, a probe in the lift pin and having a refractive index changed by an electric field of the wafer, the probe including an electro-optical crystal, an optical waveguide forming at least one internal path of light having a polarization characteristic changed by the changed refractive index between the probe and the wafer, and a control module controlling the lift pin and the driver. The lift pin moves to first and second positions. The control module calculates a strength of the electric field of the wafer, using electric field data measured using the probe at each of the first and second positions.

20 Claims, 10 Drawing Sheets

(51) Int. Cl.
*H01L 21/683* (2006.01)
*H01L 21/687* (2006.01)

(56) References Cited

U.S. PATENT DOCUMENTS

| | | |
|---|---|---|
| 10,083,883 B2 | 9/2018 | Tedeschi et al. |
| 11,053,592 B2 | 7/2021 | Yadav |
| 2004/0130341 A1* | 7/2004 | Kawanishi ............ G01R 31/311 324/754.23 |
| 2009/0066952 A1* | 3/2009 | Wu .................... G01R 29/0885 356/365 |
| 2009/0097185 A1 | 4/2009 | Shannon et al. |
| 2010/0271744 A1 | 10/2010 | Ni et al. |
| 2011/0235675 A1* | 9/2011 | Matsudo ............. H01L 21/6831 374/E11.001 |
| 2014/0269826 A1* | 9/2014 | Wu ................... H01L 21/67248 269/14 |
| 2018/0226282 A1* | 8/2018 | Hoi ....................... G01J 5/0007 |
| 2022/0050132 A1 | 2/2022 | Matsumoto et al. |
| 2023/0170192 A1* | 6/2023 | Guo ................. H01L 21/67253 156/345.28 |

FOREIGN PATENT DOCUMENTS

| | | |
|---|---|---|
| KR | 1020220079794 A | 6/2022 |
| WO | 2022119010 A1 | 6/2022 |

\* cited by examiner

ELECTRIC FIELD MEASURING APPARATUS AND METHOD OF MEASURING ELECTRIC FIELD USING THE SAME

CROSS-REFERENCE TO RELATED APPLICATION

This application is based on and claims priority under 35 U.S.C. § 119 to Korean Patent Application No. 10-2021-0184295, filed on Dec. 21, 2021, in the Korean Intellectual Property Office, the disclosure of which is incorporated by reference herein in its entirety.

BACKGROUND

The inventive concept relates to an electric field measuring apparatus and a method of measuring an electric field by using the same, and more particularly, to an electric field measuring apparatus for measuring the strength of an electric field of a wafer in a plasma chamber and a method of measuring an electric field by using the same.

A measuring apparatus that measures the strength of an electric field of a wafer may not include a conductive material. A measuring apparatus including a conductive material may act as noise that disrupts the uniform distribution of plasma in a plasma chamber. Therefore, the strength of an electric field of a wafer may not be accurately measured.

SUMMARY

The inventive concept provides an electric field measuring apparatus for measuring the strength of an electric field of a wafer in a plasma chamber and a method of measuring an electric field by using the same.

According to an aspect of the inventive concept, an electric field measuring apparatus includes an electrostatic chuck provided with a through hole and configured to hold a wafer using an electrostatic force, a lift pin configured to pick up the wafer and vertically move through the through hole, a driver configured to vertically move the lift pin along the through hole, a probe in the lift pin and having a refractive index changed by an electric field of the wafer, the probe including an electro-optical crystal, an optical waveguide configured to form at least one internal path of light having a polarization characteristic changed by the changed refractive index between the probe and the wafer, and a control module configured to control the lift pin and the driver. The lift pin is further configured to move to a first position and a second position at a different vertical level than the first position. Each of the first and second positions is at a lower vertical level than the wafer. The control module is further configured to calculate a strength of the electric field of the wafer, using electric field data measured using the probe at each of the first and second positions.

According to an aspect of the inventive concept, an electric field measuring apparatus includes an electrostatic chuck provided with a through hole and configured to hold a wafer using an electrostatic force, a lift pin configured to pick up the wafer and vertically move through the through hole, a driver configured to vertically move the lift pin along the through hole, a probe in the lift pin and having a refractive index changed by an electric field of the wafer, the probe including an electro-optical crystal and a reflector, a light source configured to generate and output light toward the probe, an optical waveguide configured to form at least one internal path of light having a polarization characteristic changed by the changed refractive index between the probe and the wafer, a detector configured to receive an optical signal of reflected light reflected from the probe and measure a strength of the optical signal, a signal processing module configured to convert the optical signal into an electrical signal, and a control module configured to control the lift pin and the driver. The lift pin is configured to move to a first position and a second position at a different vertical level than the first position. Each of the first and second positions is at a lower vertical level than the wafer. The control module is further configured to calculate a strength of the electric field of the wafer, using electric field data measured using the probe at each of the first and second positions.

According to an aspect of the inventive concept, a method of measuring an electric field includes locating a wafer on an electrostatic chuck, changing a refractive index of an electro-optical crystal by locating a probe in a first position, the probe including the electro-optical crystal and a reflector, receiving a first optical signal at the first position by allowing first light to be incident to and reflected from the probe at the first position, moving the probe to a second position that is at a different vertical level from the first position, receiving a second optical signal at the second position by allowing second light to be incident to and reflected from the probe at the second position, and calculating a strength of an electric field of the wafer. Each of the first and second positions is at a lower vertical level than the wafer. The probe is arranged in a lift pin in a through hole of the electrostatic chuck. The probe includes only a non-conductive material. The strength of the electric field of the wafer is calculated using the first and second optical signals.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
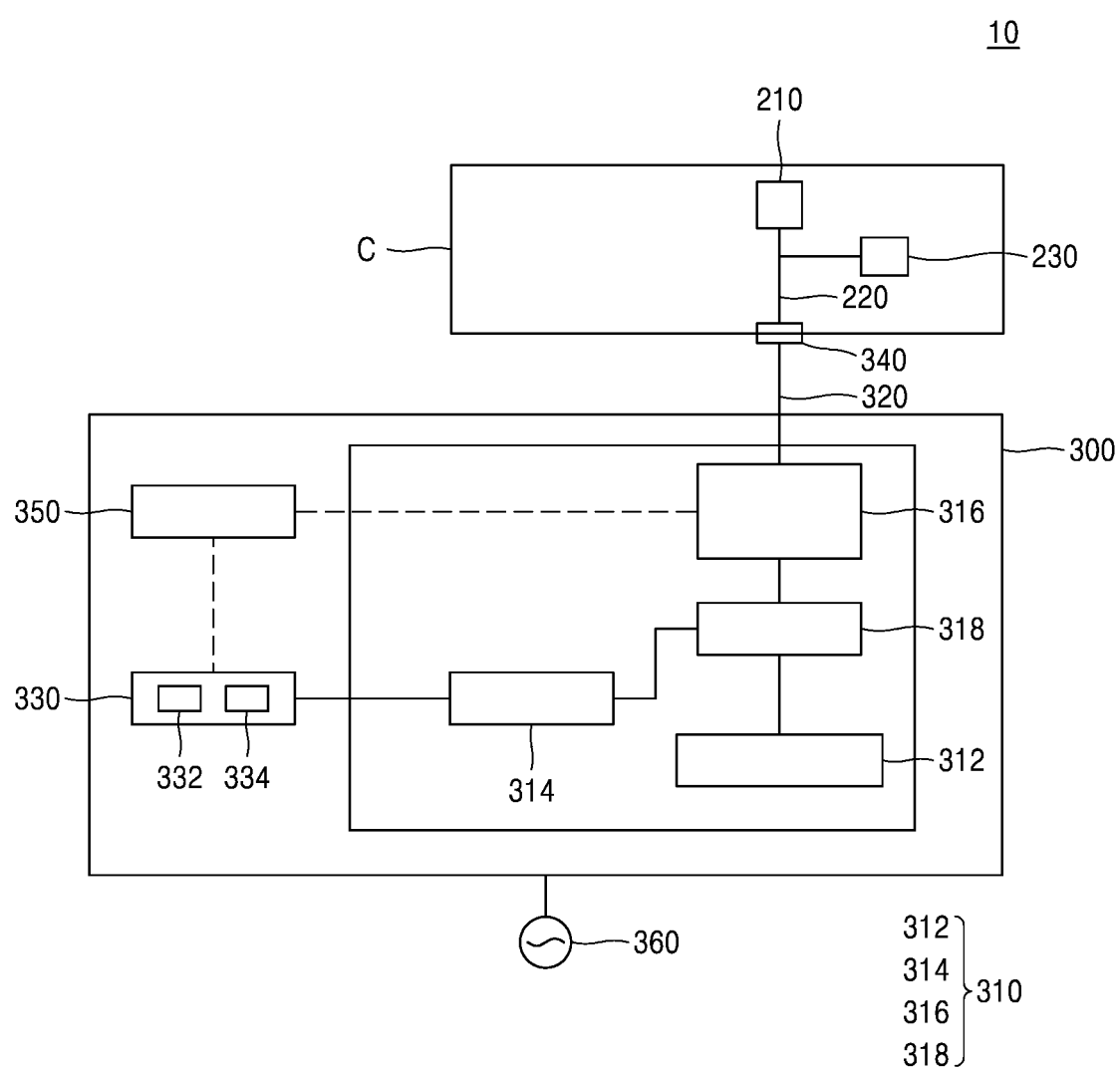
FIG. 1 is a block diagram of an electric field measuring apparatus according to an embodiment.

Hereinafter, embodiments will be described in detail with reference to the accompanying drawings. In the drawings, like reference characters denote like elements, and redundant descriptions thereof will be omitted.

FIG. 1 is a block diagram of an electric field measuring apparatus 10 according to an embodiment.

Figure 2:
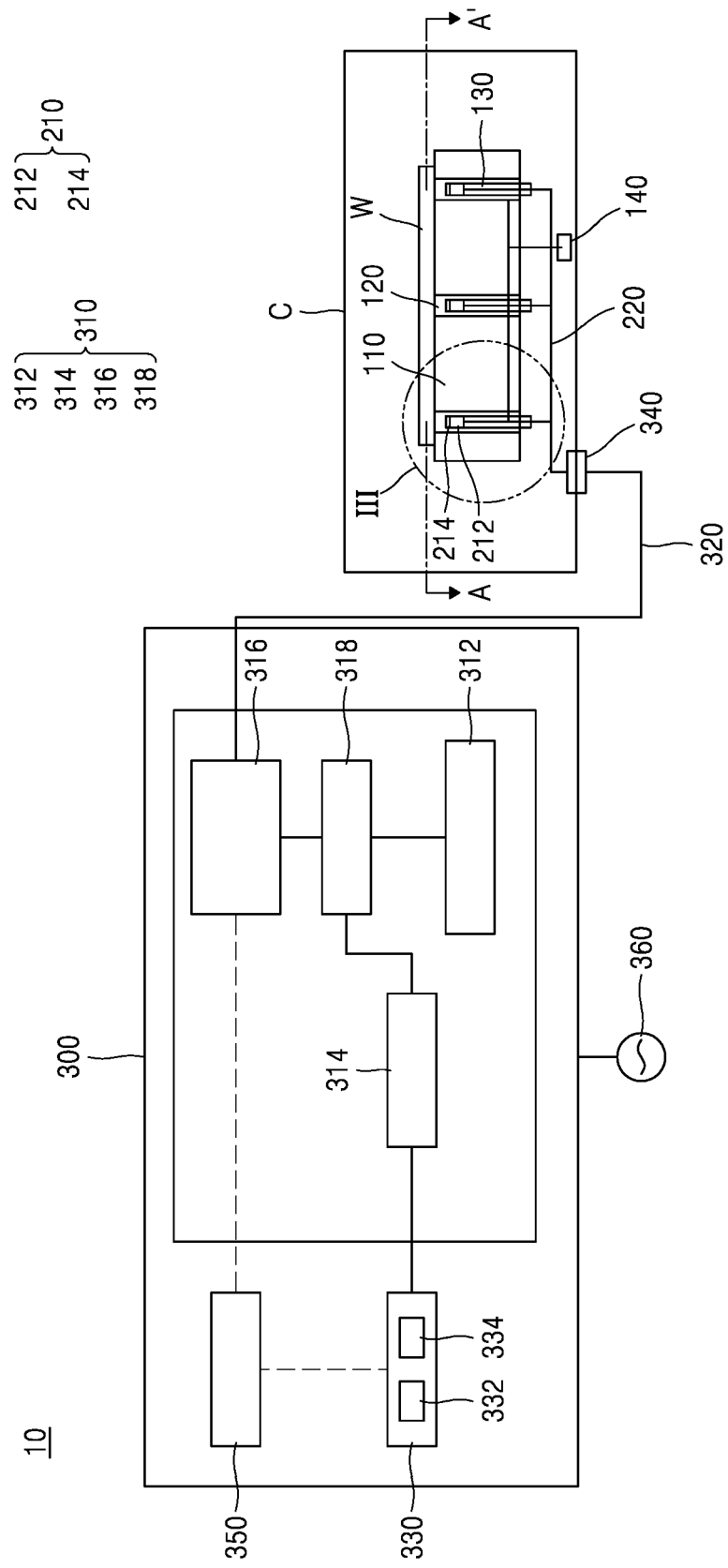
FIG. 2 is a cross-sectional view of the electric field measuring apparatus of FIG. 1.
Figure 3A:
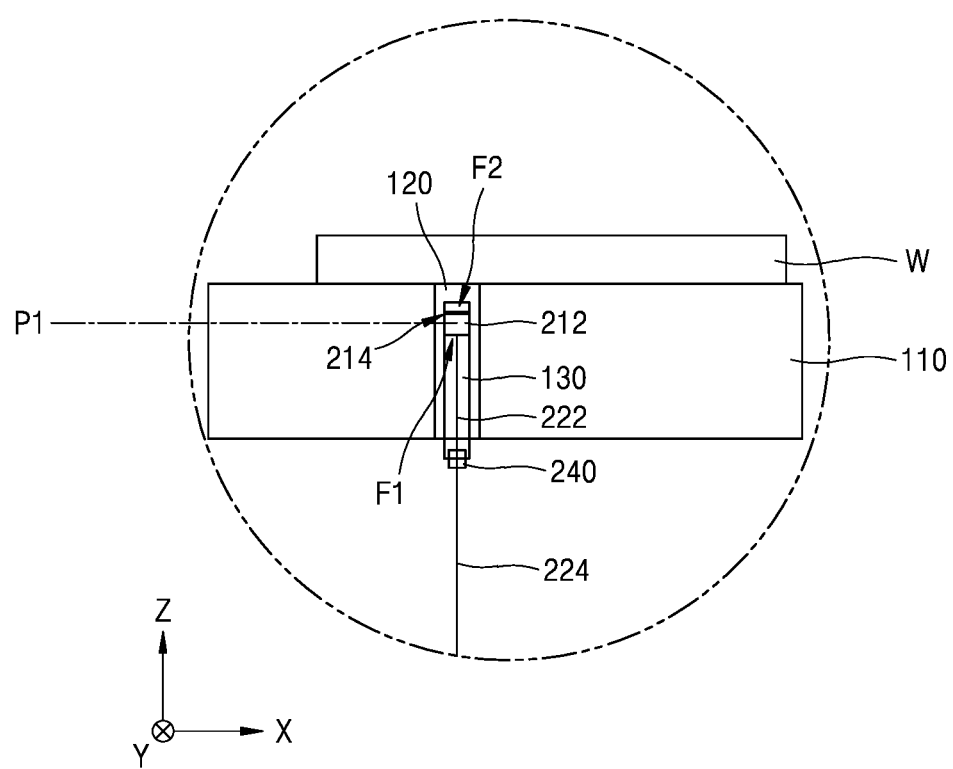
FIGS. 3A and 3B are respectively enlarged cross-sectional views of region III in FIG. 2.
Figure 3B:
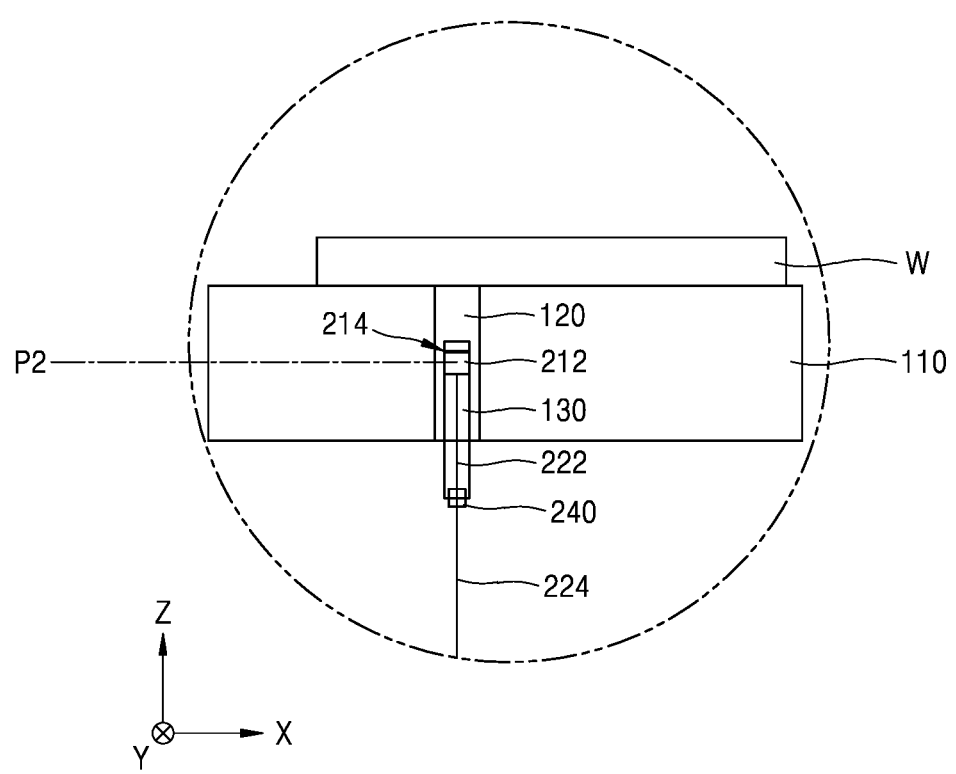
Figure 4:
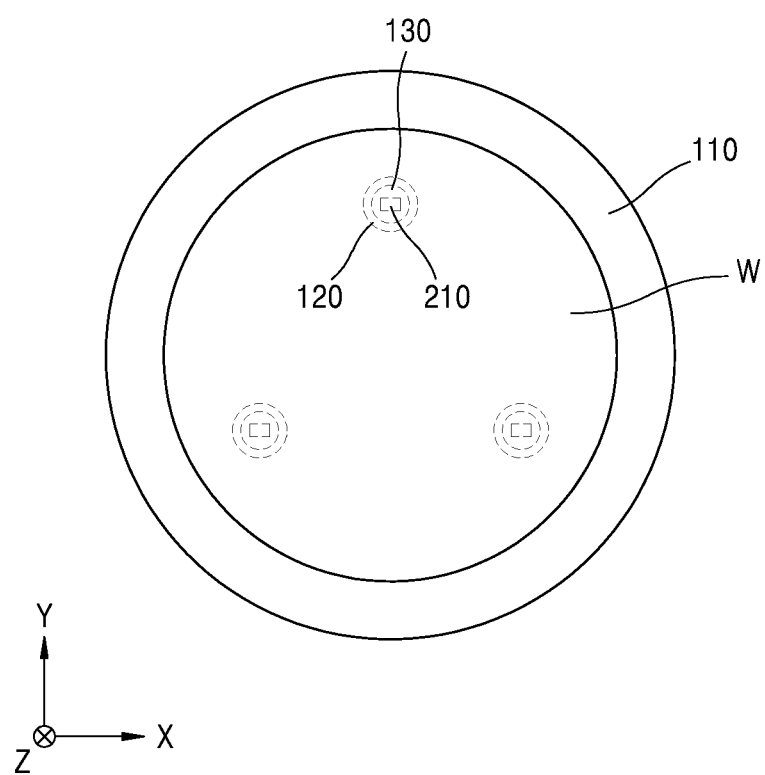
FIG. 4 is a top view of the cross-section taken along line A-A' in FIG. 2.

FIG. 2 is a cross-sectional view of the electric field measuring apparatus 10 of FIG. 1. FIGS. 3A and 3B are respectively enlarged cross-sectional views of region III in FIG. 2. FIG. 4 is a top view of the cross-section taken along line A-A' in FIG. 2.

Referring to FIGS. 1 to 4, the electric field measuring apparatus 10 may include an electrostatic chuck 110, a lift pin 130, a driver 140, a probe 210, an internal optical waveguide 220, and an optical measurement module 300.

The electric field measuring apparatus 10 may measure the strength of an electric field of a wafer W. The electric field measuring apparatus 10 may calculate the strength of an electric field of the wafer W by measuring the strength of light reflected from the probe 210 in a first position P1 and the strength of light reflected from the probe 210 in a second position P2, which is at a different vertical level than the first position P1. In an embodiment, the first and second positions P1 and P2 are below the wafer W. In an embodiment, the second position P2 may be lower than the first position P1.

To measure the strength of an electrostatic field of the wafer W, the following steps may be performed. The electric field measuring apparatus 10 may locate the probe 210 in the first position P1. After light is incident to the probe 210 in the first position P1, a signal processing module 330 may convert light reflected by a reflector 214 of the probe 210 into an electrical signal. Thereafter, the electric field measuring apparatus 10 may locate the probe 210 in the second position P2. After light is incident to the probe 210 in the second position P2, the signal processing module 330 may convert light reflected by the reflector 214 of the probe 210 into an electrical signal. Based on a difference in an electrical signal between the first position P1 and the second position P2, the strength of an electrostatic field on the wafer W may be calculated. The electrostatic field (or an electric field) may be generated by charges by the electrostatic chuck or charge accumulated in plasma processes.

After various plasma processes are performed on the wafer W, dechucking of the wafer W from the electrostatic chuck 110 may be performed. An apparatus for checking the strength and distribution of charge or electric field before the dechucking of the wafer W may be desirable. The electric field measuring apparatus 10 may measure the strength of an electric field of the wafer W. Measurement of the electric field of the wafer W may allow the wafer W to be separated from the electrostatic chuck 110 without damage. For example, if the strength of the electric field of the W is greater than a threshold value, dechucking of the wafer W may damage the wafer W because the wafer W is still held by an electrostatic force of the electrostatic chuck 110. When the strength of the electric field of the wafer W is below the threshold value, dechucking of the wafer W is performed to prevent damage on the wafer.

The plasma processes may include various semiconductor processes, such as a process of forming a film on a semiconductor substrate, a process of etching a film on a semiconductor substrate, and a process of ashing a photoresist film on a semiconductor substrate, which are performed on a substrate by using plasma in a plasma chamber.

The electrostatic chuck 110 may be located in a lower space inside a plasma chamber C. The electrostatic chuck 110 may fix and support the wafer W. The wafer W may be reliably located on the electrostatic chuck 110 by using an electrostatic fixation method or the like. The electrostatic chuck 110 may include a through hole 120 formed in a vertical direction, i.e., a Z direction. Although it is illustrated in FIG. 3 that the electrostatic chuck 110 includes three through holes 120, this is just an example. The electrostatic chuck 110 may include four or more through holes 120.

A plurality of through holes 120 may be arranged along the circumference of the electrostatic chuck 110. In an embodiment, the plurality of through holes 120 may be spaced apart from each other at a certain distance along the circumference of the electrostatic chuck 110. According to an embodiment, the through holes 120 may be in a central portion of the electrostatic chuck 110.

The lift pin 130 may be in each of the through holes 120 of the electrostatic chuck 110. The lift pin 130 may be configured to move in the vertical direction (the Z direction) in each through hole 120 of the electrostatic chuck 110. The lift pin 130 may descend in a state where the lift pin 130 supports the wafer W so as to locate the wafer W on the top surface of the electrostatic chuck 110. After the wafer W undergoes the plasma processes, the lift pin 130 may dechuck the wafer W from the electrostatic chuck 110. In other words, the lift pin 130 may separate the wafer W from the top surface of the electrostatic chuck 110 in the vertical direction (the Z direction) in a state where the lift pin 130 supports the wafer W that has undergone the plasma processes. The lift pin 130 may be in contact with the wafer W while supporting the wafer W. The lift pin 130 may include only or may be formed of non-conductive material. For example, the lift pin 130 may include or may be formed of a ceramic material. The number of lift pins 130 of the electric field measuring apparatus 10 may be the same as the number of through holes 120 of the electrostatic chuck 110. Although it is illustrated in FIG. 2 that the electrostatic chuck 110 includes three lift pins 130, it is just an example. The electrostatic chuck 110 may include four or more lift pins 130.

Each of the lift pins 130 of the electric field measuring apparatus 10 may measure the strength of an electric field of the wafer W without contacting the wafer W. For example, the vertical distance between each lift pin 130 and the wafer W may be about 0.1 mm or greater. The lift pin 130 may move to the first and second positions P1 and P2, which are at lower vertical levels than the top surface of the electrostatic chuck 110, and measure the strength of an electric field of the wafer W. The electric field measuring apparatus 10 measures an electric field of the wafer W basically using a non-contact method but does not preclude a contact method. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

For example, the lift pin 130 may move from a spot that is about 20 mm higher than the top surface of the electrostatic chuck 110 to a spot that is about 10 mm lower than the top surface of the electrostatic chuck 110. In other words, the vertical movable range of the lift pin 130 may be about 30 mm or less.

The lift pin 130 may be connected to an internal optical connector 240. The lift pin 130 may be removed from the electric field measuring apparatus 10. For example, the lift pin 130 may be removed from the internal optical connector 240. When the lift pin 130 is removed from the electric field measuring apparatus 10, the lift pin 130 may be replaced with another lift pin. Accordingly, the lift pin 130 may be easily maintained and/or repaired.

The driver 140 may provide motive power for moving the lift pin 130 in the vertical direction (the Z direction). When the lift pin 130 moves in the vertical direction (the Z direction), the probe 210 in the lift pin 130 may also move in the vertical direction (the Z direction). For example, the driver 140 may include a linear motor. For example, the driver 140 may be inside or outside the plasma chamber C.

The probe 210 may include an electro-optical crystal 212 and the reflector 214. The probe 210 may measure the strength of an electric field on the wafer W. The probe 210 may be inside the plasma chamber C. For example, the probe 210 may be embedded in the lift pin 130 including an insulating material. At a certain spot in the through hole 120, the probe 210 may measure a signal of the strength of an electric field. The probe 210 may be arranged in at least one lift pin 130. When a plurality of probes 210 are respectively arranged in lift pins 130, the electric field measuring apparatus 10 may relatively precisely measure the distribution and strength of an electric field on the wafer W.

The probe 210 may include only or may be formed of a non-conductive material. When a sensor including a conductive material is near a space in which plasma is formed in the plasma chamber C, the sensor including the conductive material may cause electrical arcing or distort plasma and thus act as noise that disrupts the uniform distribution of plasma in the plasma chamber C. However, the probe 210 including a non-conductive material, according to an embodiment, does not cause electrical arcing or distort plasma and thus, may not act as noise that disrupts the uniform distribution of plasma in the plasma chamber C. To prevent the electro-optical crystal 212 and the reflector 214 from acting as noise against plasma, the electro-optical crystal 212 and the reflector 214 may include only or may be formed of a non-conductive material.

The electro-optical crystal 212 may have a refractive index, which changes according to an external electric field. For example, the electro-optical crystal 212 may have a refractive index, which changes according to an electric field formed on the wafer W. For example, the electro-optical crystal 212 may include or may be formed of a non-conductive material, such as $LiTaO_3$, $LiNbO_3$, and ZnTe, which has a non-linear optical characteristic. However, the electro-optical crystal 212 is not limited to the materials mentioned above and may include other various non-conductive materials.

The refractive index of the inside of the electro-optical crystal 212 may linearly change according to the strength of an electric field applied to the electro-optical crystal 212. Such an electro-optical effect is called a Pockels effect. Because the change in the refractive index of the probe 210 is caused by an electric field formed on the wafer W, the strength of the electric field on the wafer W may be calculated using the change in the refractive index of the probe 210. The change in the refractive index may cause a change in the phase of light. Accordingly, the existence or non-existence or the strength of an electric field at a certain position may be detected by, for example, allowing light to be vertically incident to the electro-optical crystal 212 and calculating a phase change of reflected light.

The probe 210 may be at a lower vertical level than the wafer W and measure the strength of an alternating electric field of the wafer W. However, the inside of the electro-optical crystal 212 of the probe 210 saturates over time, and therefore, the probe 210 may measure the strength of an electrostatic field of the wafer W by performing a plurality of measurements while moving in the vertical direction (the Z direction).

The reflector 214 may reflect light incident to the electro-optical crystal 212. Because light is incident into the electro-optical crystal 212 through a first surface F1 of the electro-optical crystal 212, the reflector 214 may be arranged at a second surface F2 of the electro-optical crystal 212, which is opposite the first surface F1. Accordingly, the light incident through the first surface F1 of the electro-optical crystal 212 may be reflected by the reflector 214 at the second surface F2 of the electro-optical crystal 212 toward the first surface F1 of the electro-optical crystal 212. Because the reflector 214 is inside the plasma chamber C, the reflector 214 may include a non-conductive material. For example, the reflector 214 may include or may be formed of a dielectric mirror film or a cholesteric liquid crystal (CLC) polymer.

The internal optical waveguide 220 may include a first optical waveguide 222 and a second optical waveguide 224. The internal optical waveguide 220 may connect the electro-optical crystal 212 to an external optical waveguide 320. The internal optical waveguide 220 may form an internal path of light inside the plasma chamber C. Accordingly, light outside the plasma chamber C may incident into the electro-optical crystal 212 through the internal optical waveguide 220. Light reflected from the reflector 214 may be transmitted to the outside of the plasma chamber C through the internal optical waveguide 220. Because the internal optical waveguide 220 is inside the plasma chamber C, the internal optical waveguide 220 may include or may be formed of a non-conductive material. In an embodiment, the internal optical waveguide 220 may include or may be an optical fiber. For example, the internal optical waveguide 220 may include only or may be formed of a non-conductive optical fiber. However, the internal optical waveguide 220 may include other optical elements, which may form the path of light, besides an optical fiber.

The first optical waveguide 222 may be inside the lift pin 130, and the second optical waveguide 224 may be outside the lift pin 130. Because the first optical waveguide 222 is inside the lift pin 130, the first optical waveguide 222 may not move or may be fixed in the inside of the lift pin 130. Accordingly, the first optical waveguide 222 may correspond to a single-mode optical fiber. In an embodiment, the first optical waveguide 222 may correspond to a polarization-maintaining optical fiber. The second optical waveguide 224 may move. For example, the second optical waveguide 224 may correspond to a polarization-maintaining optical fiber. Because the electric field measuring apparatus 10 measures the electric field of the wafer W by using polarization information of light reflected from the probe 210, the first or second optical waveguide 222 or 224 may correspond to a polarization-maintaining optical fiber.

Because the internal optical waveguide 220 is exposed to a high temperature in the plasma chamber C, a cooler 230 may cool down the internal optical waveguide 220. The cooler 230 may provide a coolant to the internal optical waveguide 220. For example, the cooler 230 may surround the internal optical waveguide 220. The coolant may be provided through a cooling path formed in the cooler 230 and cool down the internal optical waveguide 220 However, a cooling method of the cooler 230 may not be limited to a certain method. For example, the cooler 230 may be outside the plasma chamber C. In this case, the cooler 230 may provide a coolant to the internal optical waveguide 220 through a cooling path formed in the plasma chamber C.

When the internal optical waveguide 220 is exposed to plasma, the internal optical waveguide 220 may expand, and accordingly, the polarization characteristic of light inside the internal optical waveguide 220 may change. Therefore, the cooler 230 may be configured to prevent the internal optical waveguide 220 from expanding. According to an embodiment, the cooler 230 may also cool down the external optical waveguide 320.

The internal optical connector 240 may be at an end of the lift pin 130 and fix the lift pin 130. The internal optical waveguide 220 may be connected to the internal optical connector 240. The internal optical connector 240 may be selectively connected to the first optical waveguide 222 and the second optical waveguide 224. For example, the internal optical connector 240 may include a ferrule terminal. The internal optical connector 240 may connect the first optical waveguide 222 to the second optical waveguide 224.

The optical measurement module 300 may be outside the plasma chamber C. The optical measurement module 300 may allow light to be incident to the probe 210. As described above, when an electric field formed on the wafer W in the plasma chamber C is applied to the probe 210, the refractive index of the electro-optical crystal 212 of the probe 210 may change. Accordingly, an optical characteristic of light incident into the probe 210 may also change. The optical characteristic may include a polarization state of light. The optical measurement module 300 may detect light reflected from the probe 210. In an embodiment, the optical measurement module 300 may be inside the plasma chamber C.

The optical measurement module 300 may include an optical proving module 310, the external optical waveguide 320, the signal processing module 330, an external optical connector 340, a control module 350 (i.e., a controller), and a power source 360.

The optical proving module 310 may allow light to be incident into the electro-optical crystal 212 of the probe 210. The optical proving module 310 may detect light reflected from the reflector 214. The optical proving module 310 may include a light source 312, a detector 314, a polarization controller 316, and a circulator 318.

The light source 312 may generate light. In an embodiment, the light source 312 may include or may be a laser and/or a light emitting diode (LED) but may not be limited to a particular light source. The light may be in a visible spectrum or a near-infrared spectrum. For example, the wavelength range of the light may be between about 0.3 μm and about 3 μm. The light generated by the light source 312 may be incident to the probe 210 through the external optical waveguide 320 and the internal optical waveguide 220.

The detector 314 may detect light reflected from the probe 210. As described above, because the refractive index of the inside of the electro-optical crystal 212 is changed by the electric field formed on the wafer W inside the plasma chamber C, the light reflected from the electro-optical crystal 212 may have an optical characteristic, which is changed by the changed refractive index of the inside of the electro-optical crystal 212. For example, the optical characteristic may include a polarization state of light. Accordingly, the light detected by the detector 314 may have information about the electric field formed on the wafer W.

The electric field detection by the electric field may refer to not direct detection of the strength of an electric field but detection of a signal or data informing the strength of the electric field. For example, the detector 314 may detect an electrical signal such as current, or an optical signal such as light, and the electrical signal or the optical signal may include information about the strength of an electric field. Hereinafter, a signal or data detected by the detector 314 is referred to as an "electric field", and the term "electric field data" is used to be distinguished from the strength of an electric field.

The polarization controller 316 may control the polarization characteristic of incident light, i.e., light incident to the probe 210, and the polarization characteristic of reflected light, i.e., light reflected from the probe 210. The polarization controller 316 may be between the light source 312 and the probe 210. Although the polarization controller 316 is between the circulator 318 and the probe 210 in an embodiment, the location of the polarization controller 316 may not be limited to a particular one.

The circulator 318 may be between the light source 312 and the polarization controller 316. The circulator 318 may separate light incident to the probe 210 from light reflected from the probe 210 in the external optical waveguide 320. The circulator 318 may transmit the separated light to the detector 314. For example, the circulator 318 may separate the reflected light by the probe 210 from the incident light to the probe 210, and transmit the separated reflected light to the detector 314.

The external optical waveguide 320 may connect the optical probing module 310 to the probe 210. The external optical waveguide 320 may form an external path of light outside the plasma chamber C. For example, the external optical waveguide 320 may connect the polarization controller 316 of the optical probing module 310 to the probe 210. The external optical waveguide 320 may be connected to an internal optical waveguide 220 in the plasma chamber C. In an embodiment, the external optical waveguide 320 may include or may be an optical fiber. The length of the external optical waveguide 320 may be variously changed. Accordingly, the external optical waveguide 320 may correspond to a polarization-maintaining optical fiber. However, the external optical waveguide 320 may include or may be other optical elements, which may form the path of light, besides an optical fiber.

The signal processing module 330 may receive information about light detected by the detector 314. For example, the information about light may include the strength or polarization state of the light. The signal processing module 330 may detect an electrical signal such as current, or an optical signal such as light. Electric field data, i.e., information about the strength of an electric field of the wafer W, may be included in the detected electrical signal or optical signal. The signal processing module 330 may convert an optical signal detected by the detector 314 into an electrical signal. For example, the signal processing module 330 may include an electro-optical sensor 336.

The signal processing module 330 may further include a filter 332 and an amplifier 334. The filter 332 may remove noise from detected light. The amplifier 334 may amplify the light from which noise has been removed. For example, the detected light may be converted to electrical signals by the signal processing module 330. The noise of the detected light may be included in the converted electrical signals. The filter 332 may remove noise from the electrical signal, and then, the amplifier 334 may amplify the noise-removed electrical signal. The amplified electrical signal may be transmitted to the control module 350.

The external optical connector 340 may be mounted on an outer wall of the plasma chamber C. The external optical waveguide 320 may be connected to the external optical connector 340. The external optical connector 340 may be selectively connected to the internal optical connector 240. Accordingly, the optical measurement module 300 may be selectively connected to the probe 210 according to the connection between the internal optical connector 240 and the external optical connector 340. In an embodiment, the internal optical connector 240 and the external optical connector 340 may not be separate from each other but be integrated into a form of a single optical connector.

In an embodiment, light incident to the probe 210 and light reflected from the probe 210 may be transmitted through one internal optical waveguide 220 and one external optical waveguide 320. In an embodiment, the electric field measuring apparatus 10 may include a plurality of internal or external optical waveguides 220 or 320.

The control module 350 may receive an electrical signal from the signal processing module 330. The control module 350 may receive the polarization characteristic of light controlled by the polarization controller 316. The polarization characteristic of light controlled by the polarization controller 316 may be converted into an electrical signal and then transmitted to the control module 350. The control module 350 may measure a change in the optical characteristic of light. The optical characteristic of light is detected from the electrical signal received by the signal processing module 330. The optical characteristic change may represent the strength of light. As described above, the strength of an electric field on the wafer W may be calculated from the optical characteristic change measured by the control module 350. The control module 350 may store data such as a detected electrical signal of light.

The control module 350 may also control the vertical position of the probe 210. For example, the signal processing module 330 may control the driver 140 to vertically move the lift pin 130, in which the probe 210 is arranged, in the vertical direction (the Z direction). In an embodiment, the probe 210 may be at different positions and measure the strength of an electric field.

The control module 350 may be implemented by hardware, firmware, software, or a combination thereof. For example, the control module 350 may include a computing device such as a workstation computer, a desktop computer, a laptop computer, and a tablet computer. For example, the control module 350 may include a memory device such as read-only memory (ROM) and random access memory (RAM), and a processor such as a microprocessor, a central processing unit (CPU), and a graphics processing unit (GPU), which is configured to perform a certain operation and algorithm. The control module 350 may include a receiver and a transmitter to receive and transmit electrical signals.

In an embodiment, the operations of the lift pin 130 and the probe 210 in the plasma chamber C and/or the operations of the optical measurement module 300 may be performed in real time during a time when a plasma process is performed. For example, according to an embodiment, the electric field measuring apparatus 10 may measure the electric field of the wafer W in real time while a plasma process is being performed.

The power source 360 may provide power to the optical probing module 310, the signal processing module 330, and/or the control module 350.

In an electric field measuring apparatus according to the related art, at least one element includes a conductive material, which causes arcing or distorts plasma inside the plasma chamber C, and may thus act as noise disrupting or disturbing the uniform distribution of plasma.

The electric field measuring apparatus according to the related art may measure the strength of alternating electric field but may not measure the strength of an electrostatic field. Therefore, when the wafer W is dechucked from the electrostatic chuck 110, a lot of charges remain in the wafer W, and accordingly, the wafer W is apt to be broken.

However, according to an embodiment, because all elements of the electric field measuring apparatus 10 include only or may be formed of a non-conductive material, the reliability of the electric field measuring apparatus 10 may be relatively high.

The electric field measuring apparatus 10 may compare electric field data, which are measured at the first position P1 below the wafer W using the probe 210, with electric field data, which is measured at the second position P2 at a different vertical level below the wafer W than the first position P1 using the probe 210, and measure the strength of an alternating electric field and/or electrostatic field of the wafer W.

Figure 5:
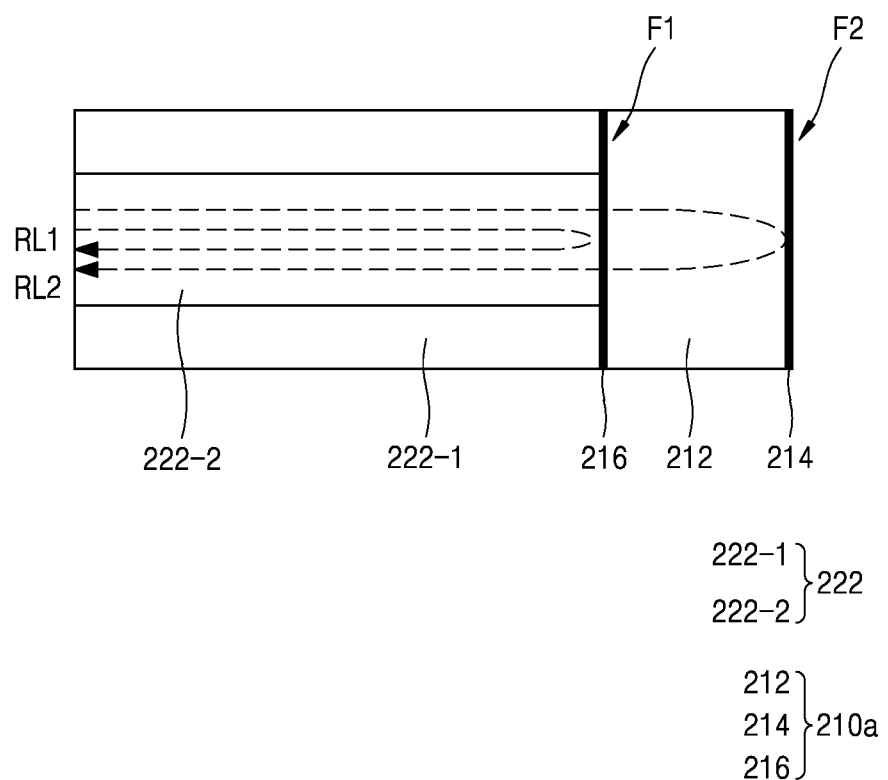
FIG. 5 is a diagram showing moving directions of light in a probe and a first optical waveguide, according to an embodiment.

FIG. 5 is a diagram showing moving directions of light in a probe 210a and the first optical waveguide 222, according to an embodiment.

Referring to FIG. 5, the probe 210a may include the electro-optical crystal 212, the reflector 214, and an auxiliary reflector 216. The first optical waveguide 222 may include a jacket 222-1 and a core 222-2. The core 222-2 may provide a path through which light travels, and the jacket 222-1 may surround and protect the core 222-2.

Light, which is incident to the probe 210a through the first optical waveguide 222, may be incident into the electro-optical crystal 212. The light incident into the electro-optical crystal 212 may be reflected by the reflector 214 such that reflected light may be formed. While the light is traveling in the electro-optical crystal 212, the optical characteristic of the light may change. For example, the optical characteristic may include a polarization state. The optical characteristic may change according to the strength of an electric field in the electro-optical crystal 212. The strength of an electric field in the electro-optical crystal 212 may be calculated by measuring the optical characteristic.

The probe 210a may include the auxiliary reflector 216 at the first surface F1 of the electro-optical crystal 212. The auxiliary reflector 216 may perform substantially the same function as the reflector 214. Accordingly, light incident to the probe 210a may be divided into first reflected light RL1 reflected from the auxiliary reflector 216 and second reflected light RL2 reflected from the reflector 214.

Although the inventive concept fundamentally relates to measuring the strength of an electric field of the wafer W by using the polarization state of the second reflected light RL2, the inventive concept does not preclude measuring the strength of an electric field of the wafer W by using the strength (i.e., an intensity) of reflected light resulting from the interference between the first reflected light RL1 and the second reflected light RL2. For example, when the electro-optical crystal 212 is relative thick in a direction that is parallel with the moving direction of the first reflected light RL1 and the second reflected light RL2, the strength of an electric field of the wafer W may be measured using the polarization state of the second reflected light RL2. When the electro-optical crystal 212 is relative thin in the direction that is parallel with the moving direction of the first reflected light RL1 and the second reflected light RL2, the strength of an electric field of the wafer W may be measured using the strength (i.e., an intensity) of reflected light resulting from the interference between the first reflected light RL1 and the second reflected light RL2.

Figure 6:
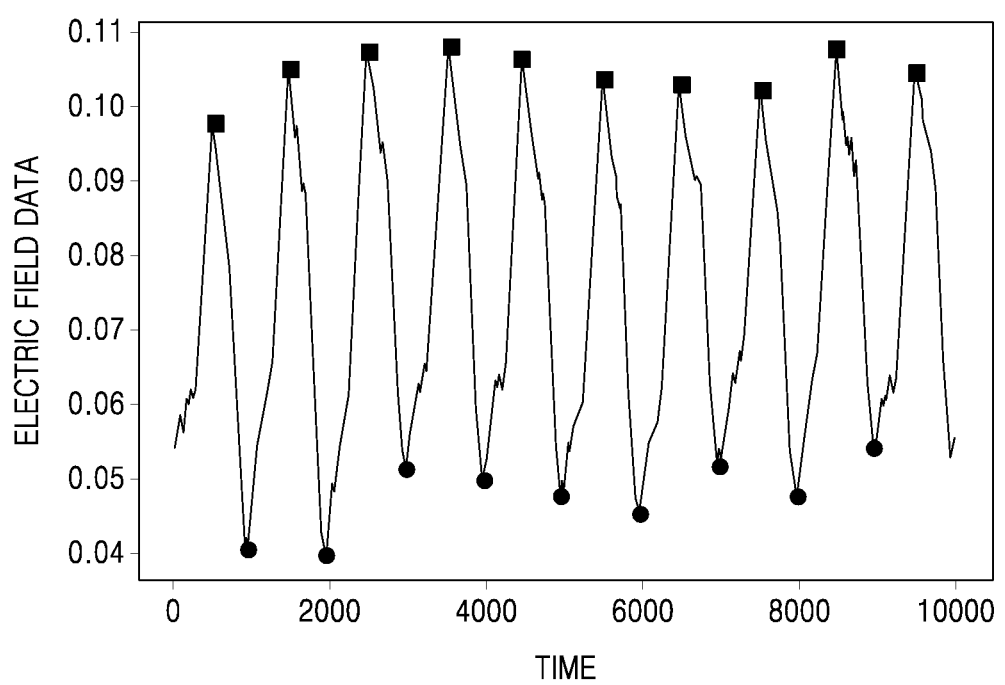
FIG. 6 is a graph of electric field data measured using a probe over time, according to an embodiment.

FIG. 6 is a graph of electric field data measured using the probe 210 over time, according to an embodiment.

Referring to FIGS. 3A and 6, the horizontal axis of the graph may represent a time for a process, and the vertical axis of the graph may represent electric field data measured using the probe 210. The process may be a process of measuring the strength of an electric field of the wafer W. During the process, the probe 210 may repeatedly move in the vertical direction (the Z direction). For example, the lift pin 130, in which the probe 210 is arranged, may repeatedly move in the vertical direction (the Z direction).

To measure the electric field data of the wafer W by using the probe 210, firstly, the control module 350 may locate the probe 210 in the first position P1, which is at a lower vertical level than the wafer W. Thereafter, light may be emitted to the probe 210 and then reflected from the probe 210, and the reflected light may be detected by the detector 314. The control module 350 may measure a first refractive index of the electro-optical crystal 212 and/or first electric field data, using the strength of light, which is detected by the detector 314 after being generated by the light source 312. Thereafter, the control module 350 may locate the probe 210 in the second position P2, which is at a different vertical level than the first position P1. Thereafter, the control module 350 may allow light to be incident to the probe 210 and measure a second refractive index of the electro-optical crystal 212 and/or second electric field data at the second position P2. The control module 350 may measure the strength of an electrostatic field of the wafer W by using a vertical level difference between the first and second positions P1 and P2 and a size difference between the electric field data at the first position P1 and the electric field data at the second position P2.

Figure 7:
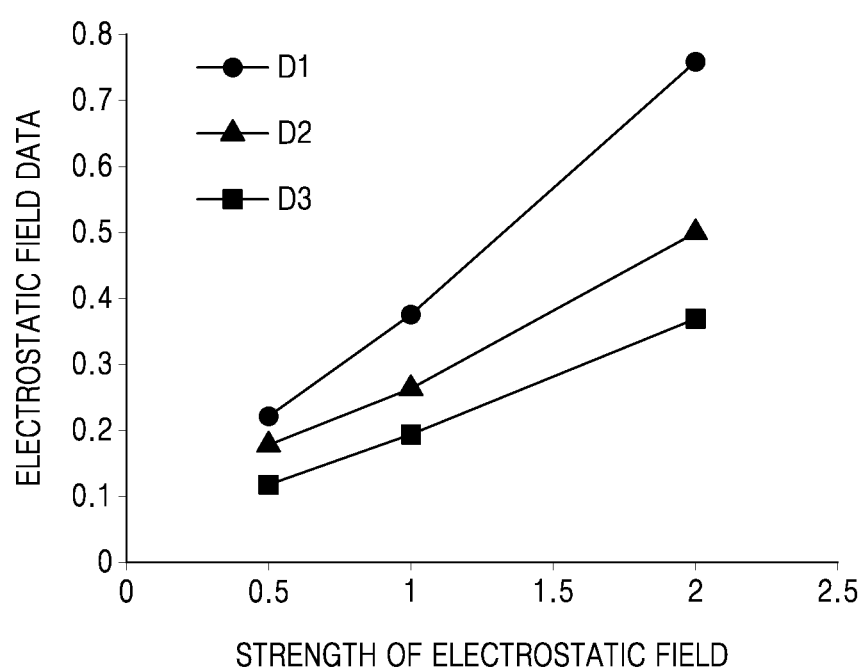
FIG. 7 is a graph of electric field data measured at a probe according to the strength of an electrostatic field, according to an embodiment.

FIG. 7 is a graph of electric field data measured using the probe 210 according to the strength of an electrostatic field and the distance between an object to be measured and the probe 210, according to an embodiment.

Referring to FIG. 7, the horizontal axis of the graph may represent the strength of an electrostatic field of an object to be measured, and the vertical axis of the graph may represent electrostatic field data measured using the probe 210. When the strength of an electrostatic field of an object to be measured increases, the electrostatic field data measured using the probe 210 may also increase.

With respect to the strength of an electrostatic field, when the distance between an object to be measured and the probe 210 increases, the value of electrostatic field data may decrease. In FIGS. 7, D1, D2, and D3 each may denote the distance between an object to be measured and the probe 210. D1 is less than each of D2 and D3, and D2 is less than D3. Accordingly, the strength of an electrostatic field of an object may be measured using the electrostatic field data measured using the probe 210 and the distance between the object and the probe 210.

However, when the position of the probe 210 is fixed, the inside of the electro-optical crystal 212 of the probe 210 may saturate, and therefore, it may be difficult to measure the strength of an electrostatic field of an object to be measured. For example, if the probe 210 measures the strength of an electrostatic filed of an object at a fixed position, the electro-optical crystal 212 of the probe 210 may saturate and the measured value may be cut off to a certain value. Accordingly, the control module 350 may repeatedly move the probe 210 in the vertical direction (the Z direction) when measuring the strength of an electrostatic field of an object to be measured. For example, the object to be measured may be the wafer W.

Figure 8:
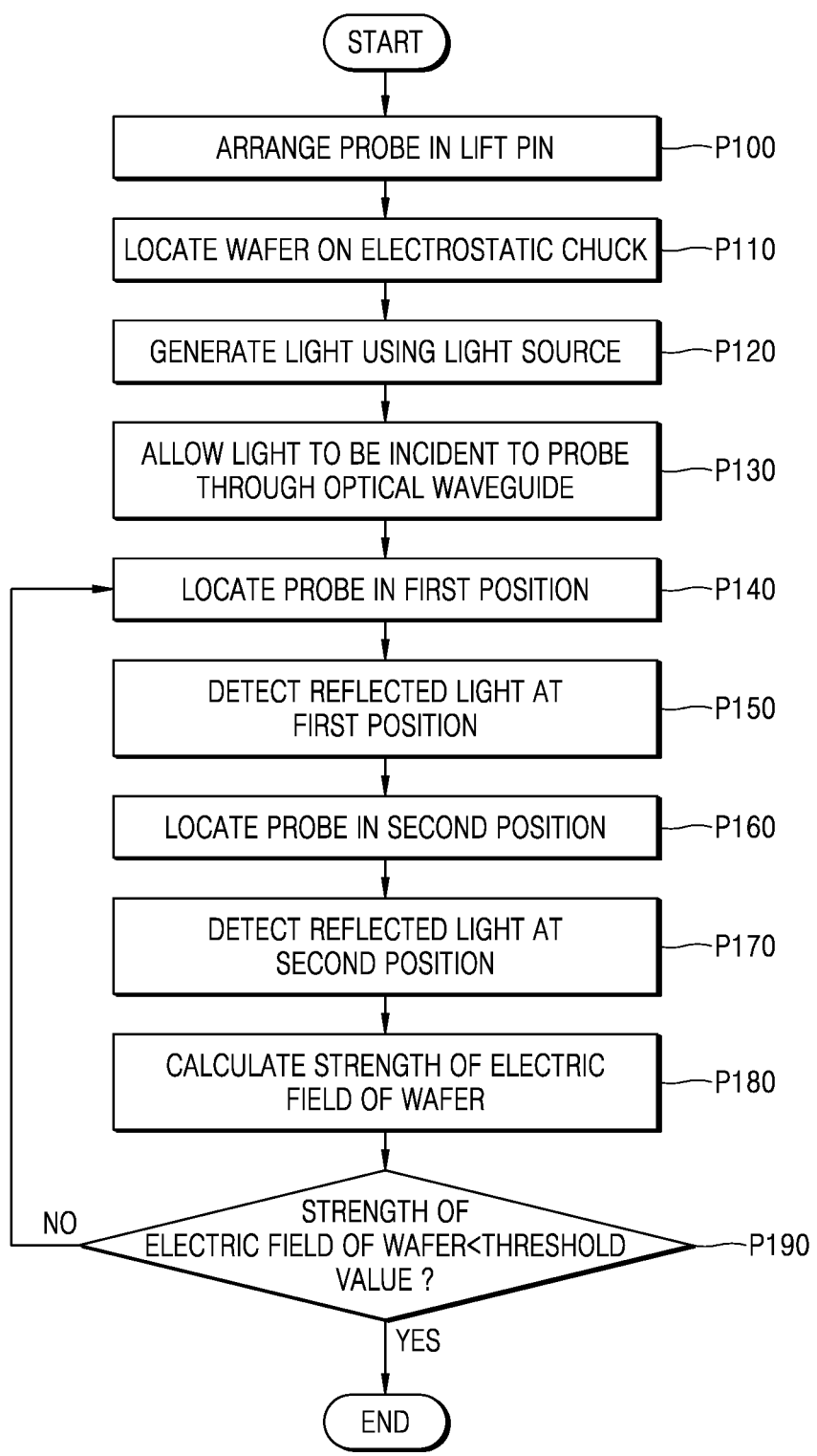
FIG. 8 is a flowchart of a method of measuring an electric field, according to an embodiment.

FIG. 8 is a flowchart of a method of measuring an electric field, according to an embodiment.

Referring to FIGS. 1, 3A, 3B, and 8, the probe 210 may be arranged inside the electrostatic chuck 110 in the plasma chamber C in operation P100. The probe 210 may be arranged in the lift pin 130 in the through hole 120 of the electrostatic chuck 110.

The wafer W may be located on the electrostatic chuck 110 in operation P110. The wafer W may be carried into the plasma chamber C for semiconductor processes. At least three lift pins 130 in respective through holes 120 of the electrostatic chuck 110 move down in the vertical direction (the Z direction) such that the wafer W may be located on the electrostatic chuck 110 or may contact the electrostatic chuck 110. After semiconductor processes are performed on the wafer W, the lift pins 130 may move upwards in the vertical direction (the Z direction) such that the wafer W may be dechucked from the electrostatic chuck 110 or may be separated from the electrostatic chuck 110. For example, the lift pins 130 may separate the wafer W from the top surface of the electrostatic chuck 110 in the vertical direction (the Z direction). Using the present inventive concept, it is determined when the wafer W, after processes are completed in a chamber, is to be dechucked without damaging the wafer W.

The wafer W may be processed using a plasma process. For example, when the plasma process includes vapor deposition, a film may be formed on the top surface of the wafer W by plasma. When the plasma process includes etching, a film on the wafer W may be etched by plasma. When the plasma process includes ashing, a photoresist film on the wafer W may be ashed.

The light source 312 may generate light in operation P120. The light may be incident to the polarization controller 316 through the circulator 318. The polarization controller 316 may control the polarization characteristic of the light.

The light may be incident to the probe 210 through an optical waveguide in operation P130. The optical waveguide may include the internal optical waveguide 220 inside the plasma chamber C and the external optical waveguide 320 outside the plasma chamber C. The light may be incident to the probe 210 through the circulator 318 and the polarization controller 316.

The probe 210 may be located at the first position P1, which is at a lower vertical level than the wafer W, in operation P140. The electro-optical crystal 212 of the probe 210 may sense an electric field on the wafer W. The refractive index of the inside of the electro-optical crystal 212 may change according to the electric field on the wafer W.

The reflector 214 of the probe 210 may reflect the light incident to the probe 210, thereby forming reflected light. The reflected light may be transmitted to the polarization controller 316 through the internal optical waveguide 220 and the external optical waveguide 320. The polarization controller 316 may control the polarization characteristic of the reflected light.

When the incident light and the reflected light travel through the internal and external optical waveguides 220 and 320, the cooler 230 may continuously cool down the internal optical waveguide 220 and/or the external optical waveguide 320.

Thereafter, the detector 314 may detect the reflected light in operation P150. The detected reflected light may be transmitted to the signal processing module 330. The signal processing module 330 may convert an optical signal of the reflected light into an electrical signal. The electrical signal that is converted from the optical signal detected at the first position P1, may be referred to as a first electrical signal.

The probe 210 may be located at the second position P2, which is at a different vertical level than in the first position P1, in operation P160. The second position P2 may be at a lower vertical level than the top surface of the electrostatic chuck 110. To move the probe 210, the lift pin 130, in which the probe 210 is arranged, may move in the vertical direction (the Z direction). To enable the lift pin 130 to move in the vertical direction (the Z direction), the driver 140 may transmit motive power to the lift pin 130.

The strength of an electric field measured by the probe 210 at the second position P2 may be different from the strength of an electric field measured by the probe 210 at the first position P1. Accordingly, the refractive index of the inside of the electro-optical crystal 212 of the probe 210 at the second position P2 may be changed.

The reflector 214 of the probe 210 may reflect the light incident to the probe 210 at the second position P2, thereby forming reflected light. Thereafter, the detector 314 may detect the reflected light in operation P170. The reflected light may be transmitted to the detector 310 through the same path as the reflected light formed in operation P150. The reflected light detected by the detector 314 may be transmitted to the signal processing module 330. The signal processing module 330 may convert an optical signal of the reflected light into an electrical signal. The electrical signal that is converted from the optical signal detected at the second position P2, may be referred to as a second electrical signal.

The filter 332 of the signal processing module 330 may remove noise from the electrical signal. Thereafter, the amplifier 334 of the signal processing module 330 may amplify the noise-removed electrical signal. The amplified electrical signal may be transmitted to the control module 350.

The strength of an electric field of the wafer W may be calculated in operation P180. The control module 350 may receive the electrical signal from the signal processing module 330. The control module 350 may also receive the polarization characteristic of light controlled by the polarization controller 316. The control module 350 may measure a change in an optical characteristic detected from the electrical signal. As described above, the strength of an electric field of the wafer W in the plasma chamber C, in which the electro-optical crystal 212 is arranged, may be calculated using the optical characteristic change measured by the control module 350.

The control module 350 may store data such as the electrical signal of detected light. The control module 350 may also perform a control function of waiting until the strength of an electric field of the wafer W decreases below a threshold value, using data provided from the electro-optical crystal 212 arranged in the lift pin 130. Using the present inventive concept, it is determined when the wafer W, after processes are completed in a chamber, is to be dechucked without damaging the wafer W.

The operations of the probe 210 and the optical measurement module 300 may be performed in real time during a time when semiconductor processes are being performed. For example, according to an embodiment, the electric field measuring apparatus 10 may perform a monitoring process in real time during a time when the semiconductor processes are being performed.

The strength of an electric field of the wafer W, which is measured in operation P180, may be compared with a preset threshold value in operation P190. For example, the threshold value may be less than or equal to about 200 V. When the strength of an electric field of the wafer W is greater than the threshold value, the wafer W may be kept on the electrostatic chuck 110 to decrease the strength of the electric field of the wafer W. Thereafter, the method may return to operation P140 to newly measure the strength of an electric field of the wafer W.

Figure 9:
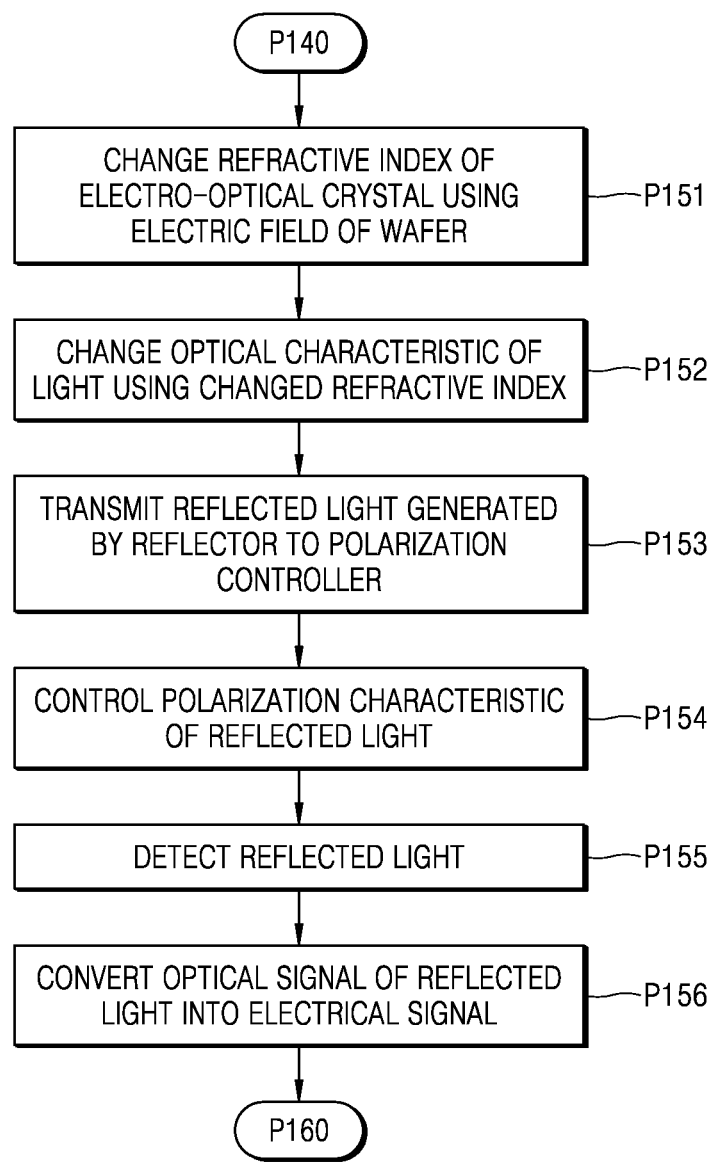
FIG. 9 is a detailed flowchart of an operation of detecting reflected light at a first position in the method of FIG. 8.

FIG. 9 is a detailed flowchart of operation P150 of detecting the reflected light at the first position P1 in the method of FIG. 8.

Referring to FIGS. 1, 8, and 9, the refractive index of the inside of the electro-optical crystal 212 may be changed by the electric field of the wafer W in operation P151. Thereafter, the light source 312 may emit light to the electro-optical crystal 212. The optical characteristic of the light incident to the electro-optical crystal 212 may be changed by the changed refractive index of the electro-optical crystal 212 in operation P152. For example, the optical characteristic may include a polarization state of the light. The reflected light may be incident to the polarization controller 316 in operation P153. The polarization characteristic of the reflected light may be controlled in operation P154 such that the strength of the reflected light decreases while passing through the polarization controller 316. The detector 314 may detect the reflected light in operation P155. Thereafter, the signal processing module 330 may convert the optical signal of the reflected light into an electrical signal in operation P156.

Operation P170 of detecting the reflected light at the second position P2 may be similar to operation P150.

While the inventive concept has been particularly shown and described with reference to embodiments thereof, it will be understood that various changes in form and details may be made therein without departing from the spirit and scope of the following claims.

What is claimed is:

1. An electric field measuring apparatus comprising:
an electrostatic chuck provided with a through hole and configured to hold a wafer using an electrostatic force;
a lift pin configured to pick up the wafer and vertically move through the through hole;
a driver configured to vertically move the lift pin along the through hole;
a probe in the lift pin and having a refractive index changed by an electric field of the wafer, the probe including an electro-optical crystal;
an optical waveguide configured to form at least one internal path of light having a polarization characteristic changed by the changed refractive index between the probe and the wafer; and
a control module configured to control the lift pin and the driver,
wherein the lift pin is further configured to move to a first position and a second position at a different vertical level than the first position,
wherein each of the first and second positions is at a lower vertical level than the wafer, and
wherein the control module is further configured to calculate a strength of the electric field of the wafer, using electric field data measured using the probe at each of the first and second positions.

2. The electric field measuring apparatus of claim 1, wherein each of the lift pin, the probe, and the optical waveguide includes a non-conductive material.

3. The electric field measuring apparatus of claim 1, further comprising:
a plurality of probes and a plurality of lift pins,
wherein the plurality of probes are respectively arranged in the plurality of lift pins.

4. The electric field measuring apparatus of claim 1, wherein, when the light is incident to the probe, the lift pin and the probe are not in contact with the wafer.

5. The electric field measuring apparatus of claim 1, wherein the probe further includes:
a reflector configured to reflect the light incident to the probe to the optical waveguide, and
wherein the reflector includes a non-conductive material.

6. The electric field measuring apparatus of claim 1, wherein the lift pin is further configured to locate the wafer on the electrostatic chuck or separate the wafer from the electrostatic chuck in a vertical direction.

7. The electric field measuring apparatus of claim 1, wherein the lift pin is removable.

8. An electric field measuring apparatus comprising:
an electrostatic chuck provided with a through hole and configured to hold a wafer using an electrostatic force;
a lift pin configured to pick up the wafer and vertically move through the through hole;
a driver configured to vertically move the lift pin along the through hole;
a probe in the lift pin and having a refractive index changed by an electric field of the wafer, the probe including an electro-optical crystal and a reflector;
a light source configured to generate and output light toward the probe;
an optical waveguide configured to form at least one internal path of light having a polarization characteristic changed by the changed refractive index between the probe and the wafer;
a detector configured to receive an optical signal of reflected light reflected from the probe and measure a strength of the optical signal;
a signal processing module configured to convert the optical signal into an electrical signal; and
a control module configured to control the lift pin and the driver,
wherein the lift pin is further configured to move to a first position and a second position at a different vertical level than the first position,
wherein each of the first and second positions is at a lower vertical level than the wafer, and
wherein the control module is further configured to calculate a strength of the electric field of the wafer, using electric field data measured using the probe at each of the first and second positions.

9. The electric field measuring apparatus of claim 8, wherein the electrostatic chuck, the lift pin, and the probe are located inside a plasma chamber, and
wherein the detector and the signal processing module are located outside the plasma chamber.

10. The electric field measuring apparatus of claim 8, further comprising:
a polarization controller configured to control a polarization characteristic of each of the incident light and the reflected light.

11. The electric field measuring apparatus of claim 8, further comprising:
a circulator configured to separate the reflected light from the incident light and transmit the reflected light to the signal processing module as the optical signal.

12. The electric field measuring apparatus of claim 8, further comprising:
an external optical connector configured to connect an internal optical waveguide to an external optical waveguide,
wherein the optical waveguide includes the internal optical waveguide inside a plasma chamber and the external optical waveguide outside the plasma chamber.

13. The electric field measuring apparatus of claim 8, wherein the optical waveguide includes a first optical waveguide inside the lift pin and a second optical waveguide outside the lift pin, and
wherein the first optical waveguide includes a single-mode optical fiber.

14. The electric field measuring apparatus of claim 8, wherein the optical waveguide includes a first optical waveguide inside the lift pin and a second optical waveguide outside the lift pin, and
wherein the first or second optical waveguide includes a polarization-maintaining optical fiber.

15. The electric field measuring apparatus of claim 8, further comprising:
an internal optical connector configured to connect a first optical waveguide to a second optical waveguide,
wherein the optical waveguide includes an internal optical waveguide inside a plasma chamber and an external optical waveguide outside the plasma chamber, and
wherein the internal optical waveguide includes the first optical waveguide inside the lift pin and the second optical waveguide outside the lift pin.

16. The electric field measuring apparatus of claim 8, wherein the electric field measuring apparatus is configured to measure a strength of an alternating electric field of the wafer and a strength of an electrostatic field of the wafer.

17. An electric field measuring apparatus comprising:
a plasma chamber
an electrostatic chuck inside the plasma chamber provided with a plurality of through holes and configured to hold a wafer using an electrostatic force;
a lift pin inside the plasma chamber configured to pick up the wafer and vertically move through the plurality of through holes;
a driver configured to vertically move the lift pin along a corresponding through hole of the plurality of through holes;
a probe in the lift pin and having a refractive index changed by an electric field of the wafer, the probe including an electro-optical crystal and a reflector;
a light source configured to generate and output light toward the probe;
an optical waveguide configured to form at least one internal path of light having a polarization characteristic changed by the changed refractive index between the probe and the wafer, the optical waveguide including an internal optical waveguide inside the plasma chamber and an external optical waveguide outside the plasma chamber;
an external optical connector connecting the internal optical waveguide to the external optical waveguide,
a detector outside the plasma chamber configured to receive an optical signal of reflected light reflected from the probe and measure a strength of the optical signal;
a polarization controller configured to control a polarization characteristic of each of the incident light and the reflected light;
a signal processing module outside the plasma chamber configured to convert the optical signal into an electrical signal;

a circulator configured to separate the reflected light from the incident light and transmit the reflected light to the signal processing module as the optical signal; and a control module configured to control the lift pin and the driver, wherein the lift pin is further configured to move to a first position and a second position at a different vertical level than the first position, wherein each of the first and second positions is at a lower vertical level than the wafer, and wherein the control module is further configured to calculate a strength of the electric field of the wafer, using a size difference between electric field data measured using the probe at each of the first and second positions.

18. The electric field measuring apparatus of claim 17, wherein each of the lift pin, the electro-optical crystal, the reflector, and the internal optical waveguide includes a non-conductive material.

19. The electric field measuring apparatus of claim 17, wherein the optical waveguide includes a first optical waveguide inside the lift pin and a second optical waveguide outside the lift pin, wherein the first optical waveguide includes a single-mode optical fiber, and wherein the second optical waveguide includes a polarization-maintaining optical fiber.

20. The electric field measuring apparatus of claim 17, wherein the plurality of through holes are spaced apart from each other at a certain distance along a circumference of the electrostatic chuck.

* * * * *